United States Patent
Ikushima et al.

(10) Patent No.: US 6,781,840 B2
(45) Date of Patent: Aug. 24, 2004

(54) FASTENING MECHANISM

(75) Inventors: Yoshihiro Ikushima, Kyoto (JP); Yutaka Ohkubo, Kyoto (JP); Hidetoshi Yoshikawa, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/134,703

(22) Filed: Apr. 26, 2002

(65) Prior Publication Data

US 2002/0172009 A1 Nov. 21, 2002

(30) Foreign Application Priority Data

Apr. 27, 2001 (JP) ........................................ 2001-131046

(51) Int. Cl.$^7$ ................................................ H05K 7/20
(52) U.S. Cl. ..................... 361/707; 165/80.2; 165/80.3; 165/185; 174/16.3; 257/719; 257/726; 257/727; 361/690; 361/710
(58) Field of Search ........................ 176/16.3; 165/80.2, 165/80.3, 185; 257/706–707, 712–713, 718–719, 726–727; 361/688–690, 704, 707–710, 714–722, 756, 758–759, 801–803, 809–810, 141, 144

(56) References Cited

U.S. PATENT DOCUMENTS

| 4,288,839 | A | * | 9/1981 | Prager et al. ............... 361/707 |
| 4,471,407 | A | * | 9/1984 | Sleder ......................... 361/707 |
| 4,695,924 | A | * | 9/1987 | Wozniczka ................. 361/720 |
| 5,191,512 | A | * | 3/1993 | Ogura et al. ................ 361/707 |
| 5,414,592 | A | * | 5/1995 | Stout et al. ................. 361/704 |
| 5,461,541 | A | * | 10/1995 | Wentland, Jr. et al. ..... 361/707 |
| 6,046,908 | A | * | 4/2000 | Feng .......................... 361/707 |

FOREIGN PATENT DOCUMENTS

| JP | 1-304800 | * | 1/1989 | ................. 361/707 |
| JP | 4-96296 | * | 3/1992 | ................. 361/707 |

* cited by examiner

Primary Examiner—Gregory Thompson
(74) Attorney, Agent, or Firm—Beyer Weaver & Thomas LLP

(57) ABSTRACT

Fastening members such as tapping screws and rivers having a shaft are used to fasten objects such as circuit elements, a circuit board and a casing to a target object such as a heat sink of a circuit unit. The target object has a uniform cross-sectional shape along a specified direction, having grooves formed over the entire length along this direction. The fastening members are passed through the objects to be fastened and inserted into these grooves perpendicularly to be affixed to the target object so as to fasten the objects to be fastened onto the target object.

2 Claims, 2 Drawing Sheets

FASTENING MECHANISM

BACKGROUND OF THE INVENTION

This invention relates to a fastening mechanism, for example, for a circuit unit in a control device for an automobile.

There are now an increasing number of motor vehicles carrying a control device for driving a large-current actuator for an automobile motor and lamp by means of a semiconductor or a circuit unit such as an inverter using a semiconductor. Semiconductors are used for carrying out a duty-control of such a large-current actuator or the switching circuit of an inverter, or for increasing the useful lifetime of the device or to make the whole device lighter.

Such a circuit unit typically has a casing for covering its surface, made of a thermally conductive material such as aluminum or an aluminum alloy, and includes a heat sink of a similar thermally conductive material attached to the inner surface of the casing. The aforementioned semiconductor is attached onto the surface of this heat sink such that the heat generated when the likes of a large-current actuator are being driven by this semiconductor will be quickly led away from the unit. It is also commonly done to attach such a heat sink to a circuit board, or to fasten the semiconductor to the circuit board through the heat sink, such that the semiconductor, and in particular its connecting part, can be fastened to the circuit board securely and protected from the mechanical stress.

FIGS. 2A and 2B show an example of such a circuit unit, including a circuit board 1, a field effective transistor (FET) 2, a heat sink 3, a casing 4 and screws 5 serving as fastening devices. The heat sink 3 has a plurality of holes 3a prepared on its front, back and bottom surfaces for accepting therein a tapping screw 5 (or a rivet throughout herein) such that the FET 2, the casing 4 and the circuit board 1 can be affixed to the heat sink 3. Explained more in detail, the bottom surface of the heat sink 3 is attached to the upper surface of the circuit board 1 and the heat sink 3 is fastened to the circuit board 1 by means of a screw 5 passed through the circuit board 1 and inserted from below into a prepared hole 3a on the bottom surface of the heat sink 3. The FET 2 is attached to the front of the heat sink 3 and secured to it by means of another screw 5 inserted into a corresponding hole 3a from the front. The heat sink 3 is further fastened to the casing 4 by means of still another screw 5 inserted into still another hole 3a on the back side of the heat sink 3. In some examples, a plurality of FETs 2 may be required, say, for forming a bridge circuit for driving a motor. In such a case, the heat sink 3 becomes an elongated member extending in the direction of their arrangement, having a plurality of holes 3a on its front surface for attaching the FETs therethrough.

In summary, prior art circuit units were structured such that a plurality of independent holes with a circular sectional shape had to be prepared on each surface of a heat sink to which other components were to be attached. Thus, their productivity was low and their production cost could not be reduced easily. These holes must be prepared by machining as a secondary process after the heat sink is prepared in its basic form. Thus, the preparation of these holes involves a number of extra steps. For example, the heat sink is preliminary produced by extrusion molding of aluminum in its basic form without any holes, and then it is set on a drilling machine for each surface to prepare the individual holes. Thus, the production of a heat sink cannot be accomplished in a single step.

Such a problem related to the drilling of holes for fastening is not limited to the production of a circuit unit for an automobile but is also present with regard to fastening mechanisms of many sorts using a fastening device such as a screw or a rivet.

SUMMARY OF THE INVENTION

It is therefore an object of this invention to provide a fastening mechanism using a fastening component such as a screw or a rivet having a shaft to be screwed or pushed into a target object to be fastened but requiring no drilling (as secondary process) for preparing holes for accepting the tips of these fastening components.

A fastening mechanism embodying this invention with which the above and other objects can be accomplished may be characterized not only as comprising one or more objects ("first objects") to be fastened by this mechanism, a target object ("second object") to which the first objects are to be fastened and one or more fastening members such as tapping screws and rivets each having a shaft with which the first object or objects are to be fastened to the second object, but also wherein the second object has a groove or grooves formed thereon and each of the first objects is fastened to the second object by having the shaft of at least one of these fastening members to pass penetratingly therethrough and inserted into the groove and affixed to the second object. Since such a groove can be formed when the second object is produced by a molding process, there is no need to drill holes for accepting tapping screws and/or rivets as a secondary process. Thus, the present invention has the merits of improving productivity and reducing production costs of products using such a fastening mechanism. The invention is particularly advantageous if the second object is produced as a member having a uniform cross-sectional shape along a specified direction and the groove is over the entire length of the member in that direction because such a member can be produced in a single production step by a molding process with the groove in the direction of releasing the molded product from the mold.

The present invention is particularly useful where the aforementioned target (second) object is a heat sink used in a circuit unit and the first objects are various components of the circuit unit such as circuit elements, a circuit board and a casing. The circuit unit may typically be a control circuit unit for a system of a different kind to be carried on a motor vehicle such as an AC inverter, an electrical power steering (EPS) system, a daytime running light (DRL) system, a power slide door system and an anti-skid braking (ABS) system.

BRIEF DESCRIPTION OF THE DRAWINGS

Throughout herein, like components are indicated by a same numeral and may not necessarily be described repetitiously even where they are components of different mechanisms.

DETAILED DESCRIPTION OF THE INVENTION

Figure 1A:
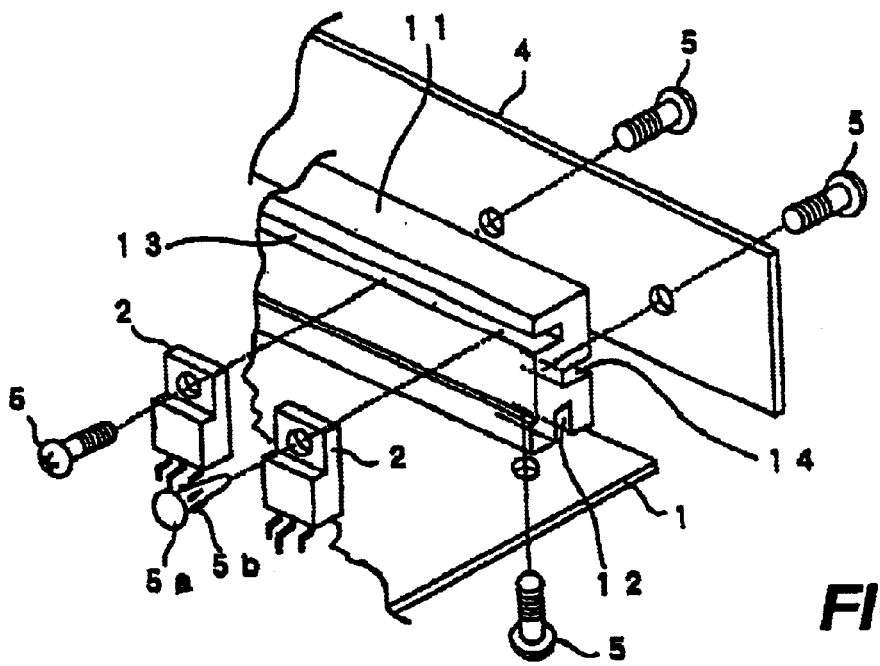
FIG. 1A is a diagonal exploded view of a fastening mechanism for a circuit unit of an inverter to be carried on a motor vehicle.
Figure 1B:
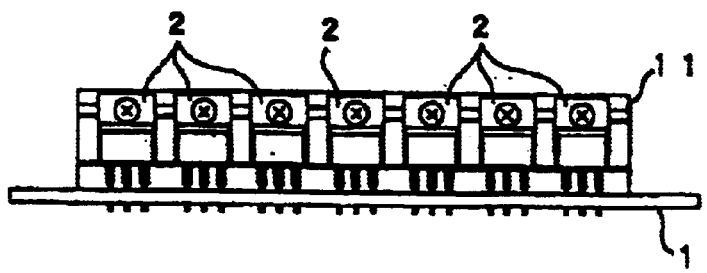
FIG. 1B is a front view of a portion of the circuit being fastened thereby.

The invention is described next by way of an example with reference to FIG. 1A which is an exploded diagonal view, FIG. 1B which is a portion of its front view and FIG. 1C which is its sectional side view. It is to be noted that only a side wall portion of the casing 4 is shown in FIG. 1A for the convenience of disclosure. Numeral 11 indicates a thermally conductive member which comprises a heat sink. A combination including both this conductive member 11 and the casing 4 may be referred to as a heat sink, but this conductive member 11 alone is the target object to which other objects are to be fastened to.

The conductive member 11 is made of aluminum, for example, by an extrusion molding process, having a uniformly elongated shape in the direction of extrusion. According to the illustrated example, it is elongated such that seven FETs 2 are adapted to be affixed in a row to one of its side surfaces, as shown in FIG. 1B. Grooves 12, 13 and 14, each capable of accepting the shaft parts of tapping screws 5 and rivets 5a to have them screwed in or pushed in, are formed on the side surfaces and the lower surface over the entire length in the longitudinal direction by the extrusion molding process. These grooves are cross-sectionally rectangular and their width is about the same as or less than the outer diameter of the shaft of the tapping screw 5.

Figure 1C:
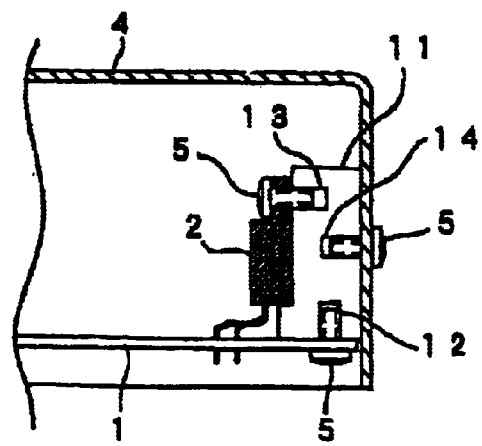
FIG. 1C is its sectional side view.
Figure 2A:
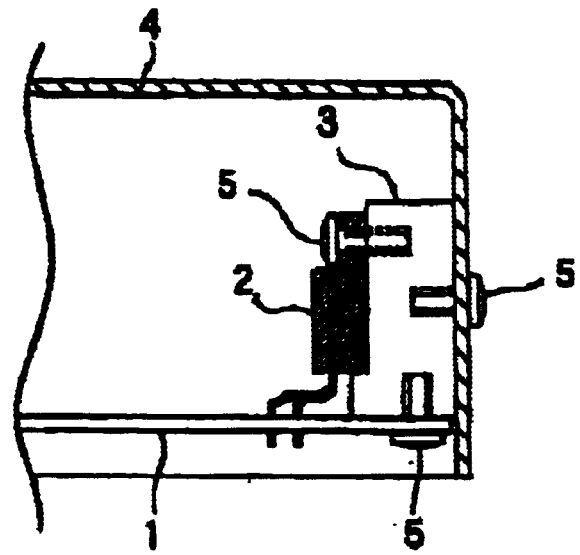
FIG. 2A is a sectional view of a prior art fastening mechanism for a circuit unit.
Figure 2B:
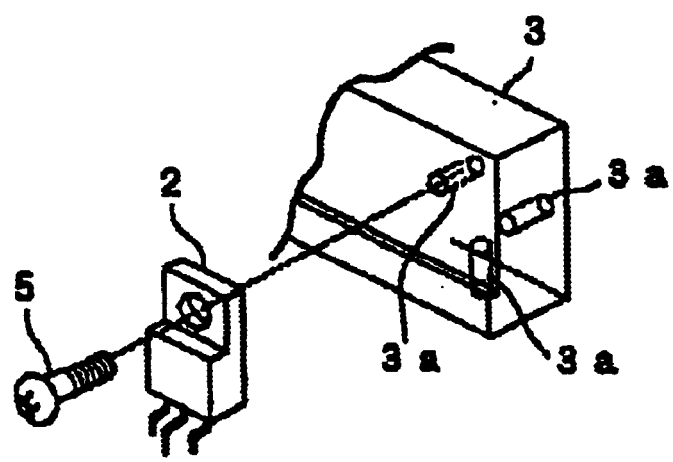
FIG. 2B is its diagonal exploded view.

As the shafts of a plurality of screws 5 are inserted at different positions along these grooves 13, 14 and 15 by contacting their inner walls as shown in FIG. 1C and screwed in or pushed in in the direction of depth of the respective groove, that is, perpendicularly to the side surface on which the respective groove is formed, FETs 2, a casing 4 and a circuit board 1 are thereby fastened. Explained more in detail, the lower surface of the conductive member 11 is attached to the upper surface of the circuit board 1 and fastened to it by means of a screw 5 screwed into the bottom groove 12 from the lower side of the circuit board 1. The FETs 2 are arranged in front of the conductive member 11, as shown in FIG. 1B, and are fastened onto the conductive member 11 by means of screws 5 inserted into the front of the conductive member 11. The backward surface of the conductive body 11 is attached to the inner side surface of the casing 4 and is affixed to it by means of screws 5 inserted from outside the casing 4 into the backward groove 14.

The circuit board 1 is also affixed to the casing 4 by means of fastening mechanisms (not shown) and a base member (not shown) is attached to the opening part of the casing 4 on the side of the back surface of the circuit board 1 so as to cover the lower surface part of the circuit unit. The circuit unit thus structured may be attached to a motor vehicle or the like by way of openings for screws provided through this base member.

The rivets 5a to be used for the fastening have a shaft which becomes thinner towards the tip like a wedge and is provided with nails 5b on the outer periphery for preventing the rivet 5a from becoming loose or released. Use of such rivets 5a instead of tapping screws 5 is advantageous in that dust particles are not generated by the tapping.

The present inventors have successfully ascertained experimentally that tapping screws and rivets can be screwed in or pushed in sufficiently securely into a simple flat groove with its width approximately the same as the outer diameter of the shaft of the fastening member. It is preferable, however, to provide a tapered surface inside the groove such that the groove becomes narrower at deeper positions such that the screws 5 and the rivers 5a can be fastened even more securely and smoothly.

According to this invention, the secondary process for drilling holes becomes completely unnecessary after the heat sink 11 is molded. In other words, the heat sink 11 can be produced as a final product by a single process of extrusion molding with high productivity. Thus, productivity can be greatly improved and the production cost can be significantly reduced. Where many fastening components such as screws are necessary, as in the case of a circuit unit, in particular, there were many holes to be drilled according to the prior art technology.

Although the invention has been described by way of only one example, this example is not intended to limit the scope of the invention. For example, not all holes according to the prior art technology need to be replaced by a groove. Where particularly strong tightening is required, for example, holes may be prepared, grooves being provided at other places. Even in such cases, the total number of required holes will decrease, and the invention can contribute to the increased productivity and reduced production cost.

Although the illustrated example showed the grooves extending over the entire length of the heat sink as a target object on which many attachments are to be made, neither is this a requirement nor is it required to be produced by an extrusion molding process. Such a component having grooves may be produced by draw molding, casting or injection molding. It is possible to form the grooves of this invention simultaneously by these methods. By a method of casting or injection molding, it is possible to produce partial grooves.

The heat sink according to this invention is not required to be attached to the casing of the circuit unit. A heat sink may be designed such that its back surface is exposed on a surface of the circuit unit, the heat sink itself serving as a portion of the casing covering the surface of the circuit unit. A structure as shown in FIGS. 1A, 1B and 1C is advantageous, however, in that even a relatively small heat sink is sufficient to protect the circuit elements (such as FETs 2) from a mechanical stress and also that the heat generated by the circuit elements can be effectively conducted away through the casing 4 with a large surface area.

In summary, all such modifications and variations that may be apparent to a person skilled in the art are intended to be included within the scope of the invention.

What is claimed is:

1. A fastening mechanism comprising:

parts of a circuit unit selected from the group consisting of circuit elements, a circuit board and a casing;

a heat sink of said circuit unit having a uniform cross-sectional shape in a specified direction, said heat sink having side surfaces and a plurality of grooves on said side surfaces over the entire length along said specified direction; and fastening members each having a shaft, said shaft passing through corresponding one of said parts of said circuit unit and being inserted into corresponding one of said grooves perpendicular to corresponding one of said side surfaces having said corresponding groove and by contacting inner walls of said corresponding groove and affixed to said heat sink and thereby fastening said corresponding part of said circuit unit onto said heat sink.

2. The fastening mechanism of claim 1 wherein said fastening members are each one selected from the group consisting of tapping screws and rivets.

* * * * *